(12) United States Patent
Zeleznik (10) Patent No.: US 9,743,203 B2
(45) Date of Patent: Aug. 22, 2017

(54) HIGH-VOLTAGE RESET MEMS MICROPHONE NETWORK AND METHOD OF DETECTING DEFECTS THEREOF

(71) Applicant: Robert Bosch GmbH, Stuttgart (DE)

(72) Inventor: Matthew A. Zeleznik, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 166 days.

(21) Appl. No.: 14/850,317

(22) Filed: Sep. 10, 2015

(65) Prior Publication Data

US 2016/0073212 A1 Mar. 10, 2016

Related U.S. Application Data

(60) Provisional application No. 62/048,571, filed on Sep. 10, 2014.

(51) Int. Cl.

| | |
|---|---|
| *G01R 31/12* | (2006.01) |
| *H04R 29/00* | (2006.01) |
| *H04R 19/04* | (2006.01) |
| *H04R 19/00* | (2006.01) |
| *H04R 3/00* | (2006.01) |
| *G01R 31/02* | (2006.01) |

(52) U.S. Cl.
CPC ......... *H04R 29/005* (2013.01); *G01R 31/025* (2013.01); *H04R 3/00* (2013.01); *H04R 19/005* (2013.01); *H04R 19/04* (2013.01); *H04R 2201/003* (2013.01); *H04R 2410/03* (2013.01)

(58) Field of Classification Search
CPC ...... H04R 29/004; H04R 19/04; H04R 19/00; H04R 3/00; G01R 31/025
USPC ................................. 324/415–424, 538, 548
See application file for complete search history.

(56) References Cited

U.S. PATENT DOCUMENTS

| | | | |
|---|---|---|---|
| 7,899,196 B2 | 3/2011 | Furst et al. | |
| 8,405,449 B2 | 3/2013 | Muza | |
| 8,421,481 B2 | 4/2013 | Kumar et al. | |
| 8,547,272 B2 | 10/2013 | Nestler et al. | |
| 2006/0008097 A1* | 1/2006 | Stenberg | H04R 19/04 381/113 |
| 2010/0013501 A1* | 1/2010 | Van Den Boom | G01D 3/08 324/679 |
| 2010/0167430 A1 | 7/2010 | Steele et al. | |
| 2010/0246859 A1* | 9/2010 | David | H02M 3/07 381/120 |

(Continued)

*Primary Examiner* — Patrick Assouad
*Assistant Examiner* — Demetrius Pretlow
(74) *Attorney, Agent, or Firm* — Michael Best & Friedrich LLP (57) ABSTRACT

A method of detecting defects in a high impedance network of a MEMs microphone sensor interface circuit. The method includes adding a high-voltage reset switch to a high-voltage high impedance network, closing the high-voltage reset switch during a start-up phase of the MEMs microphone sensor interface circuit, simultaneously closing a low-voltage reset switch of a low-voltage high impedance network during the start-up phase, simultaneously opening the high-voltage reset switch and the low-voltage reset switch at the end of the start-up phase, and detecting a defect in the high-voltage high impedance network or the low-voltage high impedance network immediately after opening the high-voltage reset switch and the low-voltage reset switch.

11 Claims, 10 Drawing Sheets

(56) References Cited

U.S. PATENT DOCUMENTS

| | | | |
|---|---|---|---|
| 2012/0019303 A1* | 1/2012 | Singh | H02M 1/14 327/333 |
| 2012/0223770 A1 | 9/2012 | Muza | |
| 2013/0129116 A1* | 5/2013 | Kropfitsch | H04R 19/005 381/107 |
| 2013/0279721 A1 | 10/2013 | David et al. | |
| 2014/0060193 A1 | 3/2014 | Zhu et al. | |
| 2014/0132294 A1 | 5/2014 | Steele et al. | |
| 2016/0029129 A1* | 1/2016 | Nicollini | H04R 19/04 381/113 |

* cited by examiner

Fig. 1

PRIOR ART

*Fig. 2*

PRIOR ART

HIGH-VOLTAGE RESET MEMS MICROPHONE NETWORK AND METHOD OF DETECTING DEFECTS THEREOF

RELATED APPLICATION

This patent claims the benefit of prior filed co-pending U.S. Provisional Patent Application No. 62/048,571; filed on Sep. 10, 2014; the entire content of which is hereby incorporated by reference.

BACKGROUND

This patent relates to MEMS microphone incorporating a reset for a high-voltage high-impedance network for the microphone bias node allowing faster, more efficient testing of the MEMS microphone.

MEMS capacitive microphones operate utilizing conservation of charge. A high impedance network, usually consisting of two anti-parallel diodes is used to apply a fixed charge across two plates of a capacitor. A high impedance network on a sense node is necessary to create the charge conservation node. A high impedance switch network on a bias node is followed by a capacitor to ground which is large in comparison to the capacitance from the sense node to ground. This capacitor serves two purposes. First the capacitor creates an AC ground on the bias side of the sensor so that in the presence of an acoustic signal, the voltage on the sense node changes. Second, the capacitor along with the high impedance network creates a low-pass filter for noise generated by the biasing circuits.

Leakage current from the high-impedance bias node to ground can degrade the performance of the microphone. The leakage current from bias to ground lowers the impedance of the high impedance network and if large enough can compromise the noise filtering of the bias circuits, ultimately degrading the noise performance of the entire microphone. Similarly, leakage current from the bias node to the sense node flows into the sense node diodes giving rise to shot-noise which also degrades the noise performance of the entire microphone. Defects near these high impedance nodes which can be due to particles, surface contamination, or bulk material defects can give rise to these leakage currents which will affect the high impedance network. Furthermore these defects can be exacerbated through reliability and environmental stresses making early detection even more important to ensuring the quality of the microphone.

U.S. patent application Ser. No. 13/040,466 describes one of many implementations for realizing high-voltage high impedance circuits.

SUMMARY

This patent describes a microphone design and corresponding test for early detection of defects to the high impedance nodes. Design of a microphone in which both high-impedance networks attached to the sensor are switched during start-up allows for a test which can identify defects in the high impedance nodes leading to compromised microphone performance.

In one embodiment, the patent provides a method of detecting defects in a high impedance network of a MEMs microphone sensor interface circuit. The method includes adding a high-voltage reset switch to a high-voltage high impedance network, closing the high-voltage reset switch during a start-up phase of the MEMs microphone sensor interface circuit, simultaneously closing a low-voltage reset switch of a low-voltage high impedance network during the start-up phase, simultaneously opening the high-voltage reset switch and the low-voltage reset switch at the end of the start-up phase, and detecting a defect in the high-voltage high impedance network or the low-voltage high impedance network immediately after opening the high-voltage reset switch and the low-voltage reset switch.

In another embodiment, the patent provides a high-voltage reset MEMs microphone sensor interface circuit. The circuit includes a charge pump, a low-voltage high impedance network, a high-voltage high impedance network, a sense capacitor, a high impedance amplifier, and an output capacitor. The low-voltage high impedance network is coupled to a direct current potential and to a sense node. The low-voltage high impedance network includes a set of anti-parallel diodes and a low-voltage reset switch. The high-voltage high impedance network is coupled to the charge pump and to a bias node. The high-voltage high impedance network includes a set of anti-parallel diodes and a high-voltage reset switch. The sense capacitor is coupled between the sense node and the bias node. The high impedance amplifier is coupled to the sense node. The output capacitor coupled between the bias node and ground. The low-voltage reset switch and the high-voltage reset switch are closed during a start-up phase of the MEMs microphone sensor interface circuit and simultaneously opened at an end of the start-up phase.

Other aspects of the patent will become apparent by consideration of the detailed description and accompanying drawings.

DETAILED DESCRIPTION

Before any embodiments of the patent are explained in detail, it is to be understood that the patent is not limited in its application to the details of construction and the arrangement of components set forth in the following description or illustrated in the following drawings. The patent is capable of other embodiments and of being practiced or of being carried out in various ways.

A MOS switch is typically connected in parallel with a high-impedance switch on the sense node, allowing the sense node to be held at a fixed potential while the other side of a capacitor is charged. Due to complexity, the high-impedance node on the high-voltage side of the capacitor is typically not switched. Inclusion of a switch on the high-voltage high-impedance network allows for microphone tests which indicate the presence of small leakage currents associated with high impedance defects. Additionally the level of leakage current which can be detected in these tests is much smaller than the leakage levels which will increase the noise of the microphone.

Figure 1:
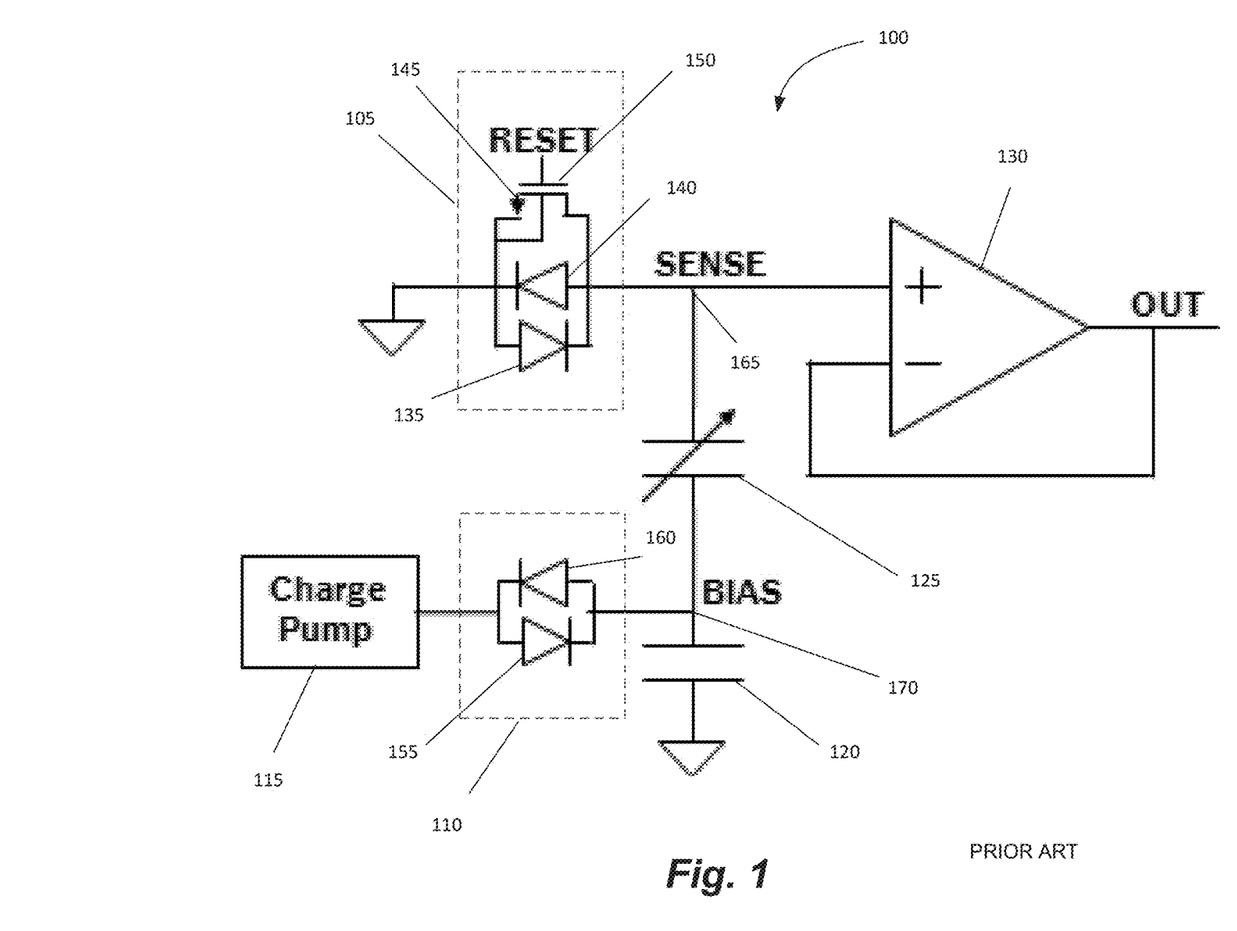
FIG. 1 is a schematic diagram of a prior art MEMs microphone sensor interface circuit.

FIG. 1 shows a schematic representation of a prior art sensor interface circuit 100. The sensor interface circuit 100 includes a low-voltage high impedance network 105, a high-voltage high impedance network 110, a charge pump 115, an output capacitor 120, a sense capacitor 125, and a high input impedance amplifier 130. The low-voltage high impedance network 105 includes a first diode 135, a second diode 140, a third diode 145, and a low-voltage reset switch 150. The first and second diodes 135 and 140 are configured as anti-parallel diodes. The high-voltage high impedance network 110 includes a fourth diode 155, and a fifth diode 160. The fourth and fifth diodes 155 and 160 are configured as anti-parallel diodes. A first connection of the low-voltage high impedance network 105 is coupled to a direct current (DC) potential, which can be ground, and a second connection is coupled to the sense capacitor 125 and an input of the high impedance amplifier 130. A sense node 165 is formed by the connection of the second connection, the sense capacitor 125, and the input of the high impedance amplifier 130.

An output of the charge pump 115 is connected to a first connection of the high-voltage high impedance network 110, and a second connection of the high-voltage high impedance network 110 is connected to the output capacitor 120 and the sense capacitor 125 forming a bias node 170.

The charge pump 115 creates a high-voltage for biasing the sense capacitor 125 and the high input impedance amplifier 130 buffers the signal produced at the sense node 165. The low- voltage high impedance network 105 at the sense node 125 creates a conservation of charge node. During start-up the low-voltage reset switch 150 is turned on (typically less than 100 ms) while the bias node 170 is charged through the charge pump 115 and the high-voltage high impedance network 110. This phase is used to put a fixed charge on the sense capacitor 125. After the start-up, the low-voltage reset switch 150 is opened the microphone becomes operational and changes in the value of the capacitance of the sense capacitor 125 produce a proportional voltage change on the sense node 165 which is buffered by the high impedance amplifier 130.

Figure 2:
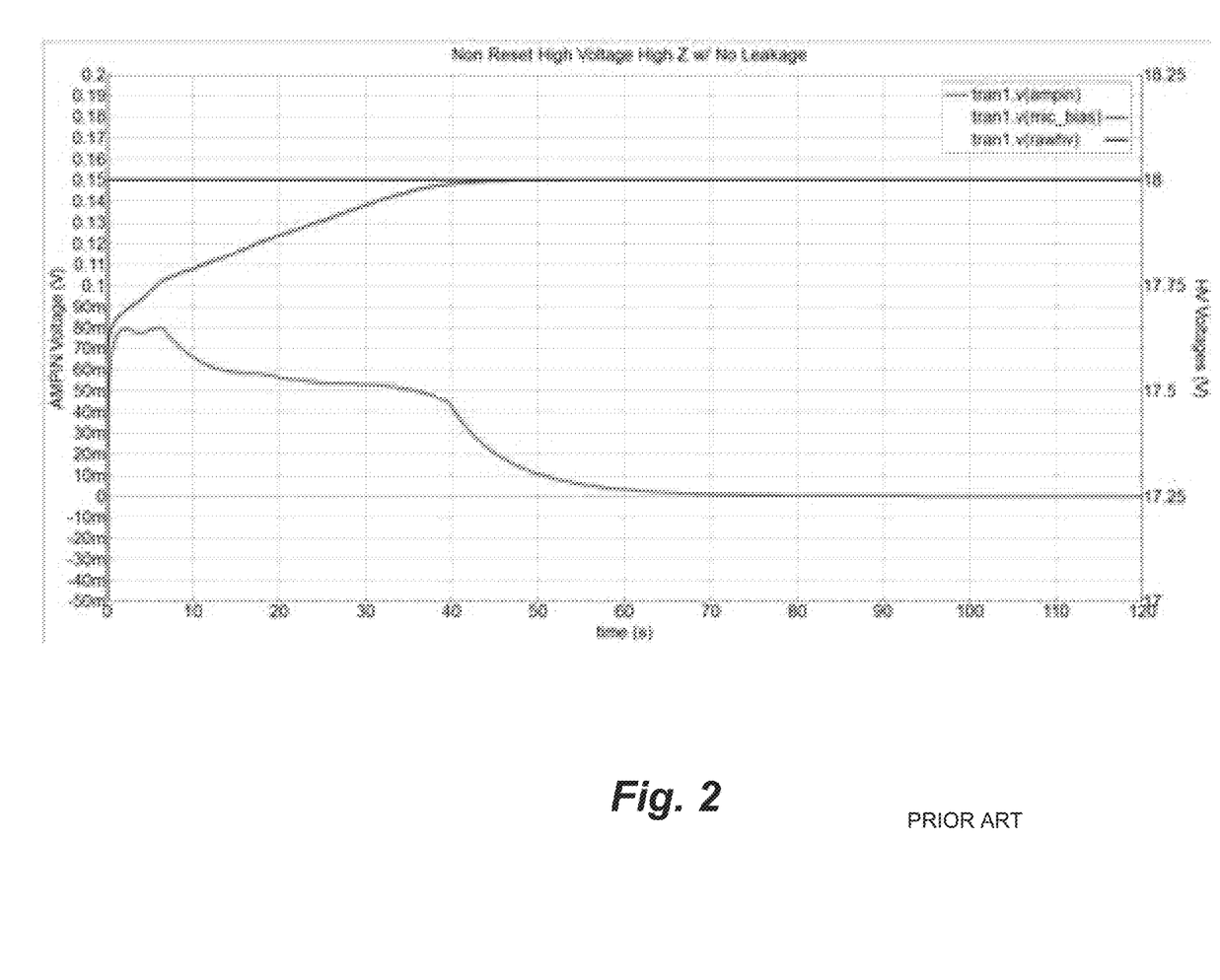
FIG. 2 is a graph of node voltages versus time for the sensor interface circuit of FIG. 1.

FIG. 2 shows the transient waveform of the charge pump 115 output voltage (rawhv), bias node 170 voltage (mic_bias) and sense node 165 voltage (ampin) for sensor interface circuit 100. During the start-up/charging phase (10 ms in FIG. 2) the sense node 165 is held at ground while the charge pump 115 and bias node 170 charge. As the charge pump 115 voltage rises an output capacitor 120 and sense capacitor 125 are charged through the high-voltage high impedance network 110. During this phase, there is a large enough voltage difference between the charge pump 115 output and the bias node 170 that one of the high-voltage high impedance diodes 155 or 160 forward conducts and charges the output and sense capacitors 120 and 125 to within a diode drop of the charge pump 115 voltage. This charging occurs quickly as the small signal impedance of the diode 155 or 160 is small when in the forward biased region. After the start-up/charging phase there exists a voltage drop from the charge pump 115 to the bias node 170. With no static current flowing off the bias node 170, the bias node 170 will continue to charge. However, the charging will become slower as the voltage drop decreases and the small signal impedance of the diode 155 or 160 increases. In FIG. 2 it can be seen that the bias node 170 has not fully charged by the time the start-up phase has ended and continues to charge through 50 seconds. The rising voltage on the bias node 170 creates a transient current through the sense capacitor 125 and, since the low-voltage high impedance network 105 is in its high impedance state, a voltage develops from the sense node 165 to ground in response to the transient current. Once the bias node 170 is fully charged to a charge pump 115 voltage the transient current does not exist and the sense node 165 will leak back to ground. In FIG. 2 this occurs from 50 to 80 seconds. After all of the currents have settled then the sense node 165 voltage returns to the voltage that it was reset to during the start-up phase; 0V in FIG. 2.

Figure 3:
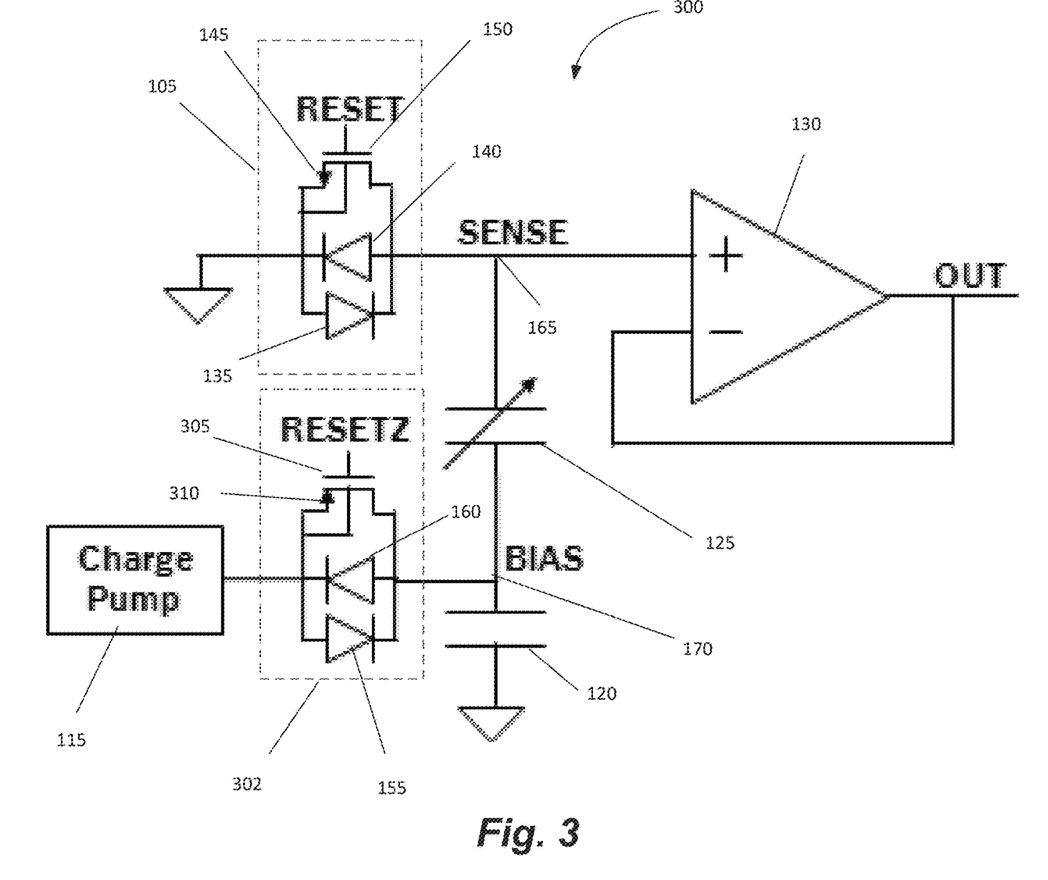
FIG. 3 is a schematic diagram of a MEMs microphone high-voltage reset sensor interface circuit in accordance to an embodiment of the disclosure.

FIG. 3 shows a schematic representation of a high-voltage reset sensor interface circuit 300. The high-voltage reset sensor interface circuit 300 is similar to the sensor interface circuit 100 (FIG. 1) except that the high-voltage high impedance network 302 includes a high-voltage reset switch 305 and a sixth diode 310.

This high-voltage reset sensor interface circuit 300 operates in the same manner as the sensor interface circuit 100 described in FIG. 1; however, during the start-up phase both the low and high voltage reset switches 150 and 305 are closed at the start of the start-up phase and simultaneously opened at the end of the start-up phase.

Figure 4:
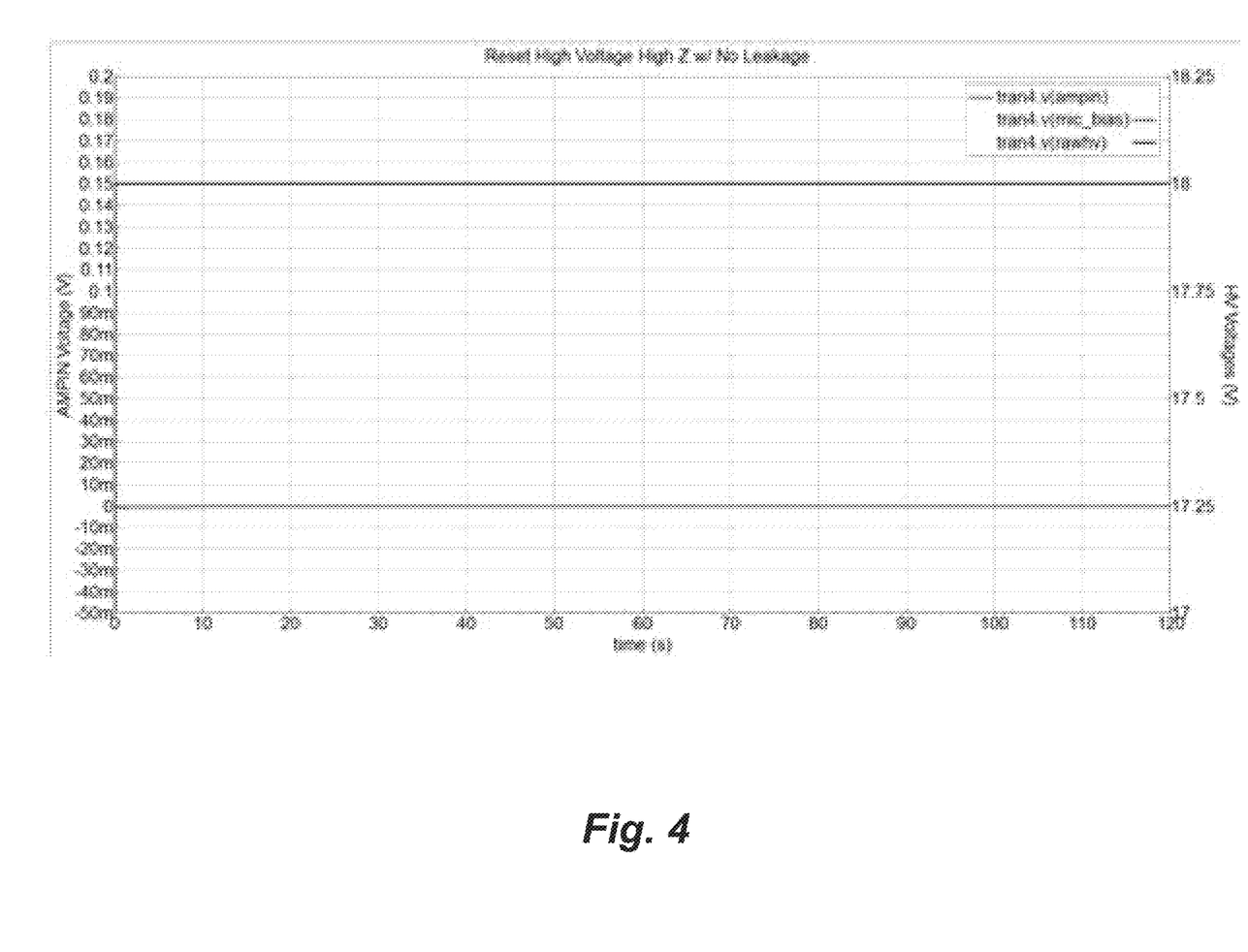
FIG. 4 is a graph of node voltages versus time for the high-voltage reset sensor interface circuit of FIG. 3.

FIG. 4 shows the transient waveform of the charge pump 115 output voltage (rawhv), bias node 170 voltage (mic_bias) and sense node 165 voltage (ampin) for the high-voltage reset sensor interface 300. During the start-up/charging phase (10 ms) the sense node 165 is held at ground through the switch 150 across the low-voltage high impedance network 105 while the bias node 170 is connected to the charge pump 115 through the high-voltage reset switch 305 across the high-voltage high impedance network 302. As the charge pump 115 voltage rises, the bias node 170 is held to the charge pump 115 voltage. At the end of the start-up phase the charge pump 115 and the bias node 170 are at the same potential. When the switches 150 and 305 across both the high-voltage and low-voltage high impedance networks 105 and 302 open there are no transient currents that flow due to charging and in the absence of any leakage currents from the bias node 170 the sense node 165 will remain at the voltage that it was reset to; 0V in FIG. 4.

Figure 5:
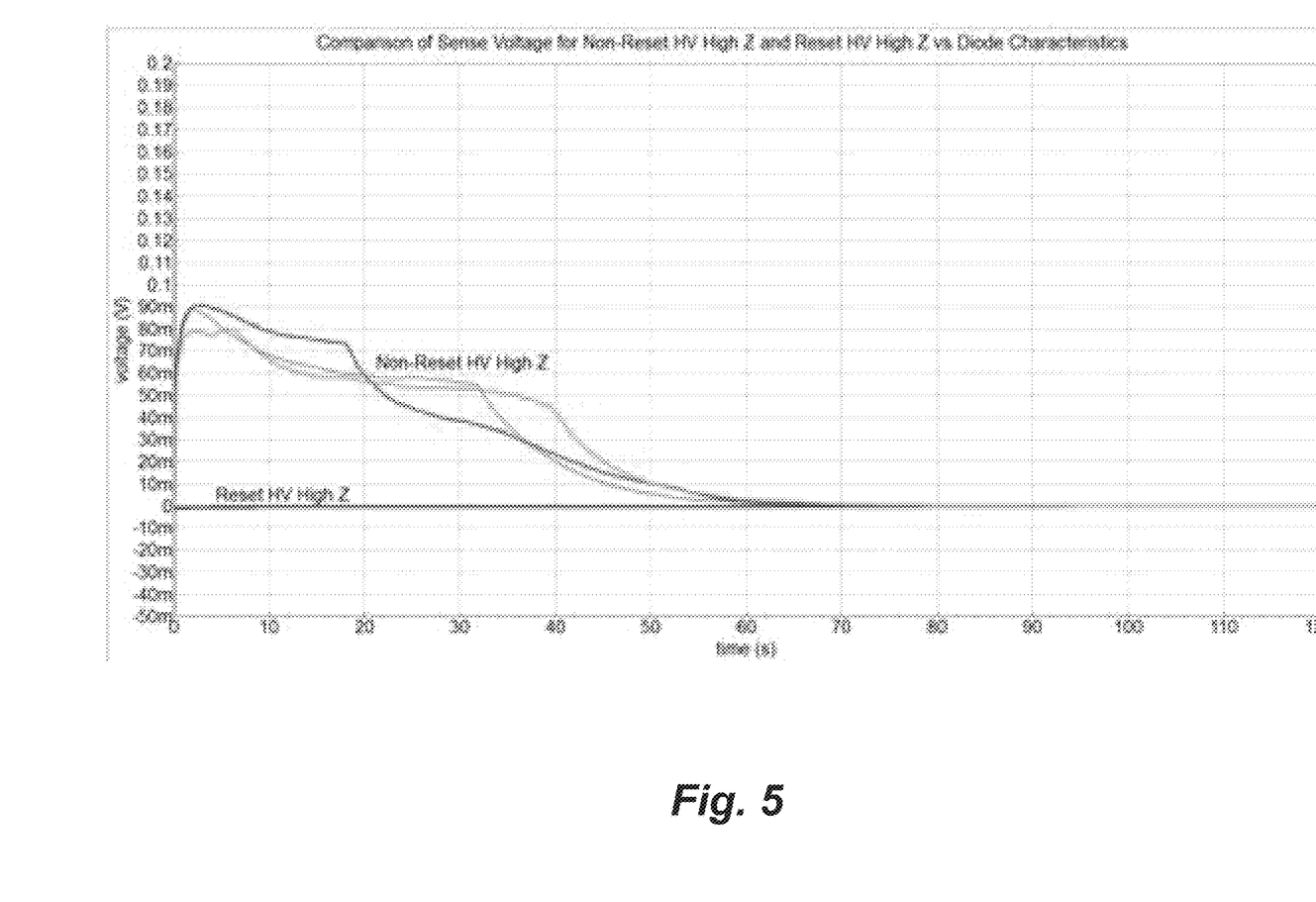
FIG. 5 is a graph comparing sense node voltage for the sensor interface circuit of FIG. 1 and the high-voltage reset sensor interface circuit of FIG. 3 versus diode characteristics.

In the sensor interface 100, the transient sense voltage heavily depends on the I-V characteristics of the diodes which are used in both high-impedance networks. Variations of these diodes 135, 140, 155, and 160 from chip-to-chip, wafer-to-wafer and lot-to-lot will affect the charging of the bias node 170 and subsequently the settling of the sense node 165. In contrast, with high-voltage reset sensor interface 300, the diode characteristics are negligible due to the high-voltage reset switch 305 pre-setting both the sense node 165 and bias node 170. FIG. 5 shows the sense node 165 voltage over time with three different sets of diodes 135, 140, 155, and 160 for both the sensor interface 100 and the high-voltage reset sensor interface 300. It should be observed that with the sensor interface 100, three distinct sense 125 voltage curves are produced. Conversely, only one sense 125 voltage curve is produced with the high-voltage reset sensor interface 300. This shows that the sense node 165 voltage is not impacted by the diode characteristics with the high-voltage reset sensor interface 300.

Figure 6:
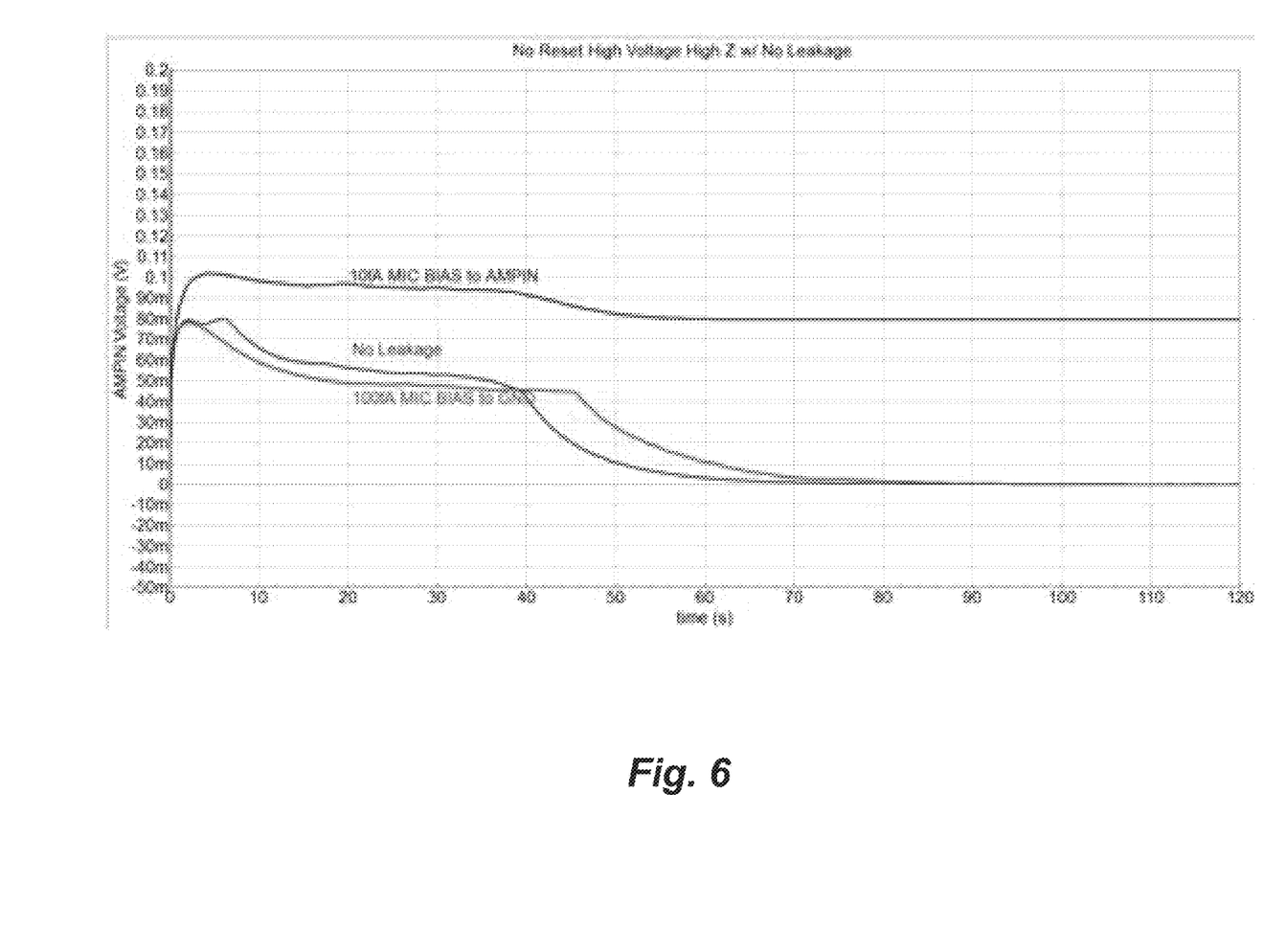
FIG. 6 is a graph of sense node voltage for the sensor interface circuit of FIG. 1 with 100 fA leakage from bias to ground and 10 fA from bias to sense.

In both systems the sense node 165 voltage is altered in the presence of leakage currents on the bias node 170, either from the bias node 170 to ground or from the bias node 170 to the sense node 165. These leakages can be due to particles, surface contamination or bulk material defects. In the sensor interface 100, current flow from the bias node 170 to ground will be in the opposite direction as the transient charging current and therefore will only have a small impact on the sense node 165 voltage. When a leakage current exists between the bias node 170 and sense node 165 it will sum with the transient current. As the transient current is largest immediately after the start-up phase it will be difficult to observe the change in the sense node 165 voltage due to this leakage until the transient current has completely settled out. FIG. 6 shows the sense node 165 voltage with a 100 fA leakage current from bias node 170 to ground and with a 10 fA leakage current from bias node 170 to sense node 165. Given that the diode characteristics on any given device are not known and can have a significant impact on the sense node 165 voltage it would be difficult to identify leakages from bias node 170 to ground due to defects on the high impedance networks 105 and 110. Furthermore, it would only be possible to identify leakages from bias node 170 to sense node 165 after the transient currents have fully settled which would require prohibitive test times for volume production.

Figure 7:
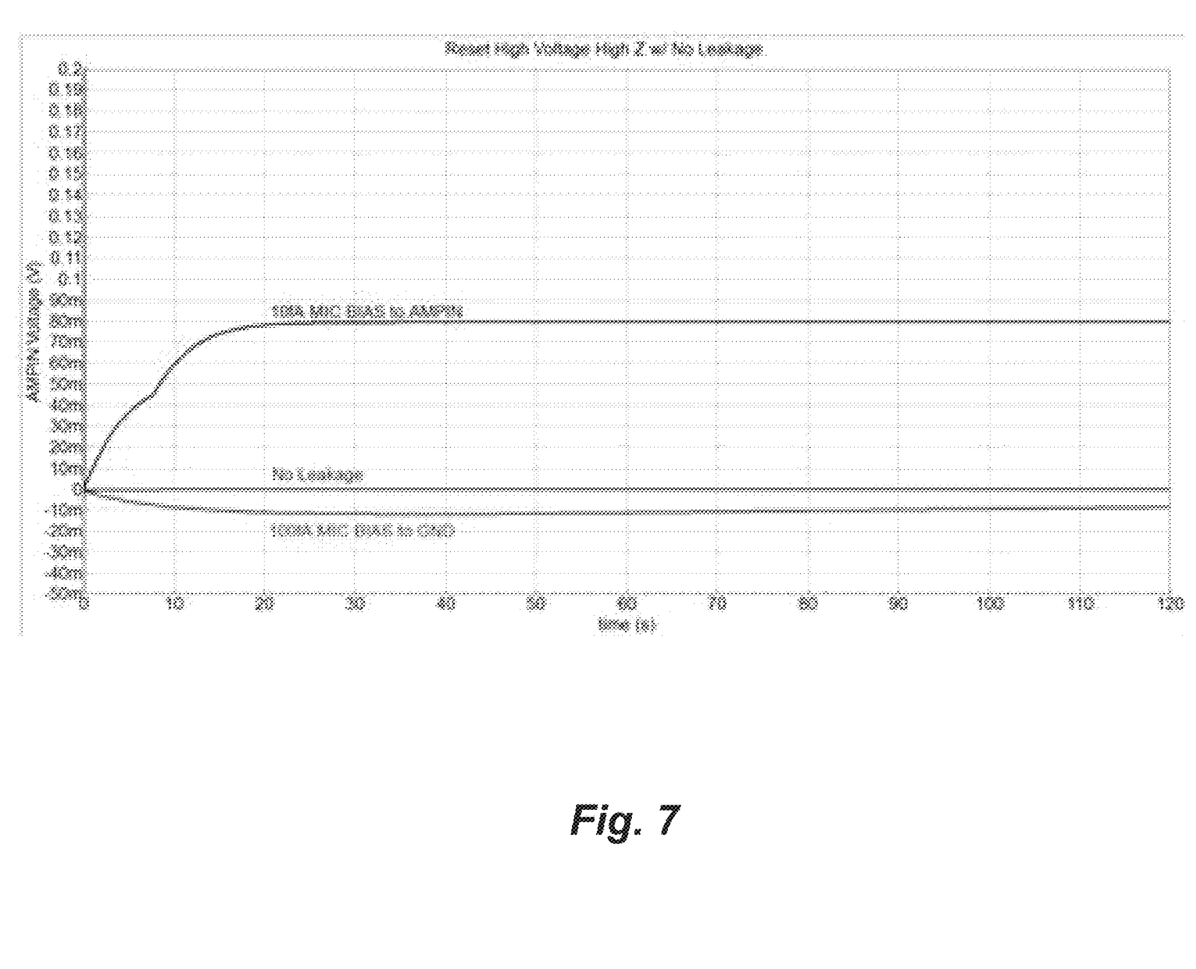
FIG. 7 is a graph of sense node voltage for the high-voltage reset sensor interface circuit of FIG. 3 with 100 fA leakage from bias to ground and 10 fA from bias to sense.

In the high-voltage reset sensor interface 300, since there are no inherent transient currents due to charging and the start-up is not impacted by the diode characteristics, any leakage currents due to defects are easily detectable immediately after start-up (i.e., within milliseconds). While the high-voltage reset switch 305 is closed, the bias node 170 is held to the charge pump 115 voltage. If a leakage current is present from the bias node 170 to ground then this current will flow through the diodes 155 and 160 on the high voltage impedance network 302 when the switch 305 is opened. The bias node 170 will then fall by a voltage determined by the amount of leakage current and the I-V curve of the diode 310. As the voltage on the bias node 170 falls, a transient current through the sense capacitor 125 will pull the sense node 165 below its reset value causing the sense node 165 to decrease in voltage. Once the voltage on the bias node 170 has settled, the transient current will be gone and the sense node 165 will leak back to ground through the low-voltage high impedance diodes 105. If a leakage current from bias node 170 to sense node 165 is present, this current will have to flow through the low voltage impedance network 105 diodes 135 and 140 and the sense node 165 will rise by a voltage determined by the amount of leakage current and the I-V curve of the low voltage impedance network 105 diodes 135 and 140. FIG. 7 shows the sense voltage with a 100 fA leakage current from bias node 170 to ground and with a 10 fA leakage current from bias 140 to sense node 165.

Figure 8:
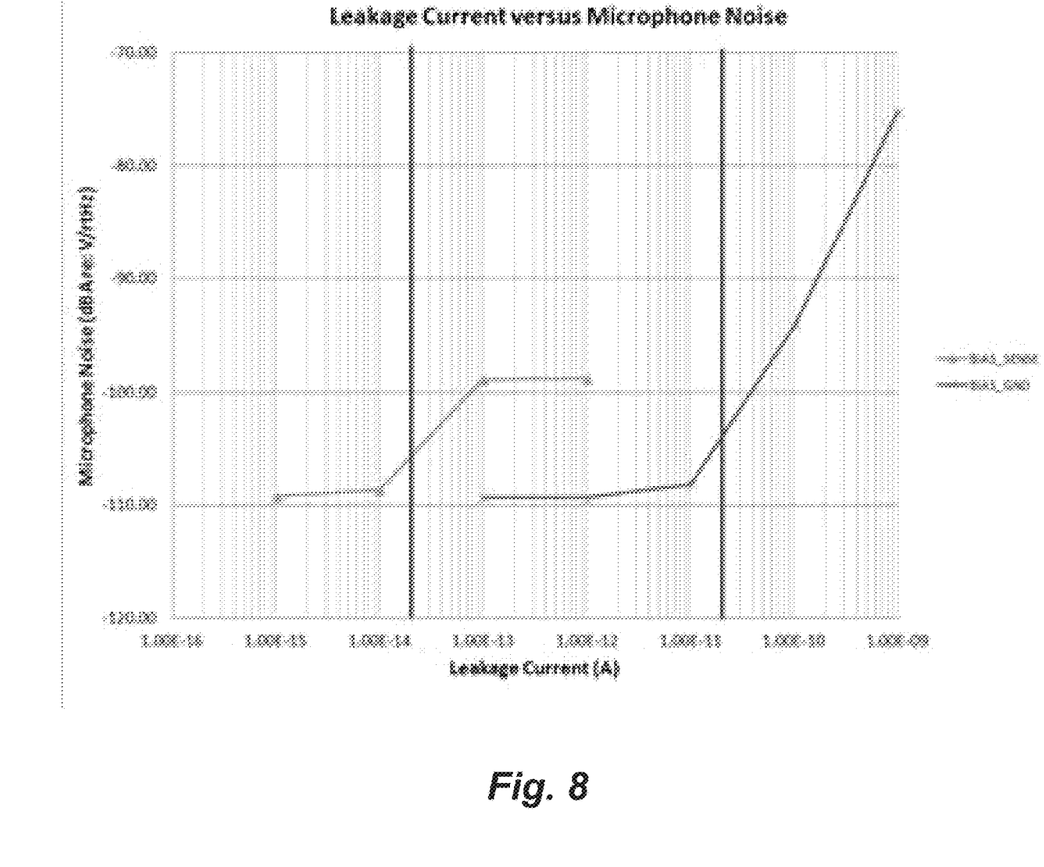
FIG. 8 is a graph of leakage current versus noise for the high-voltage reset sensor interface circuit of FIG. 3.

FIG. 8 shows an example which illustrates the impact of various leakage currents on the noise performance of the microphone with the high-voltage reset sensor interface 300. In FIG. 8 leakages above 10 fA from bias node 170 to sense node 165 create shot noise through the low-voltage high impedance network 105 which leads to degraded noise performance of the entire microphone. Similarly, leakage current from bias node 170 to ground lowers the impedance of the high voltage—impedance network 302 and subsequently reduces the noise filtering of the biasing circuits. Above 10 pA the bias node 170 to ground leakage leads to degraded noise performance of the entire microphone.

Figure 9:
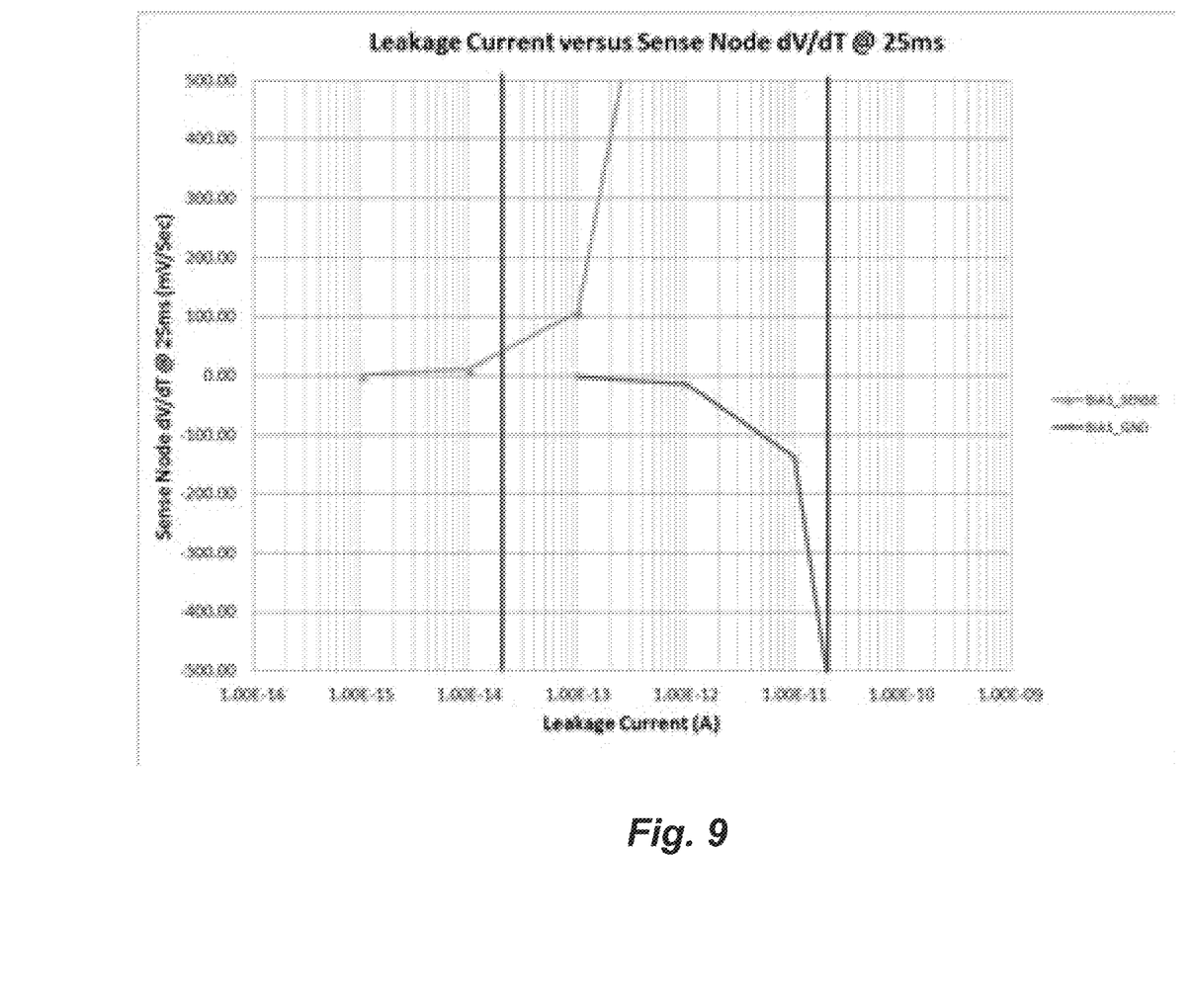
FIG. 9 is a graph of leakage current versus sense node dV/dT for the high-voltage reset sensor interface circuit of FIG. 3.

FIG. 9 illustrates the impact of various leakage currents on the slope of the of the sense node 165 voltage after the start-up phase for the high-voltage reset sensor interface 300. FIG. 9 shows that, like the noise, the rate of change in voltage at the sense node 165 can be correlated to the leakage current.

Figure 10:
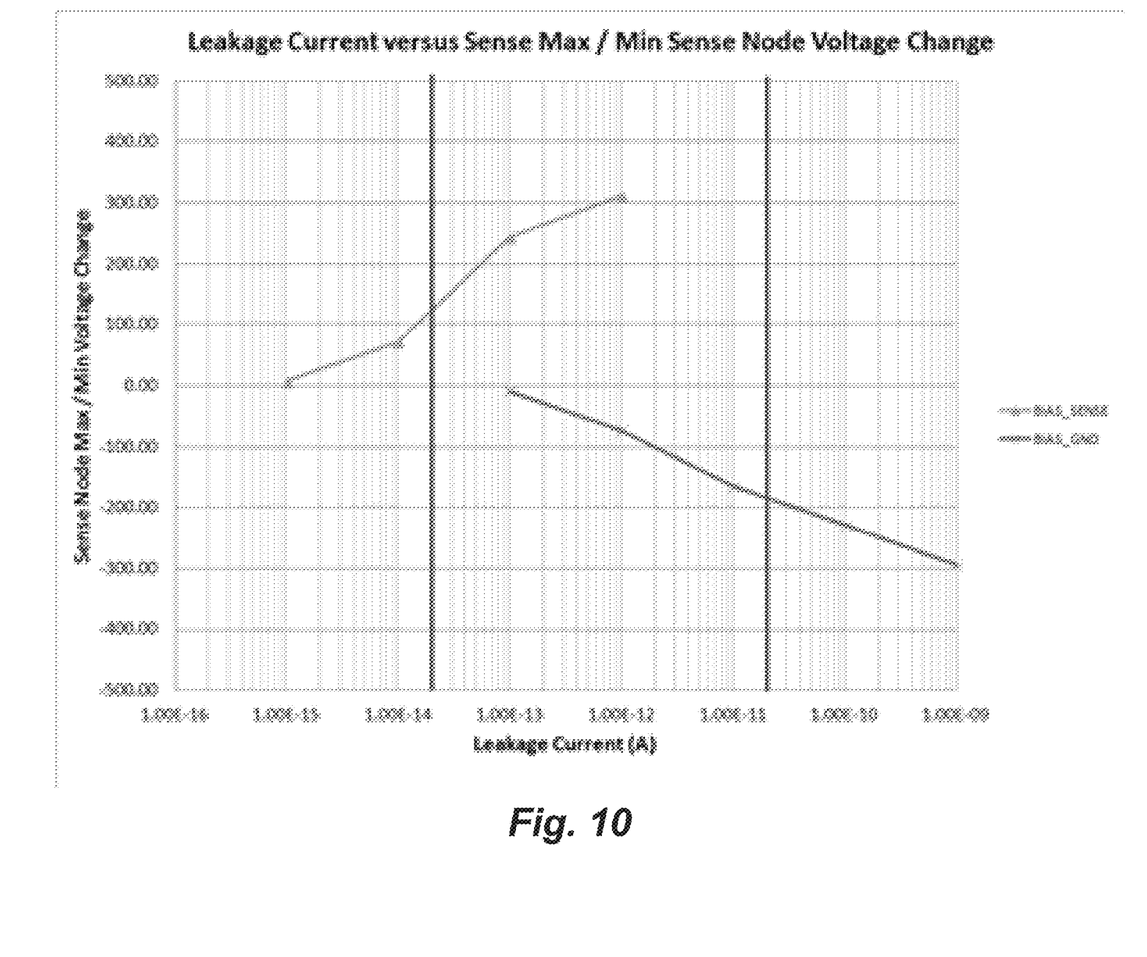
FIG. 10 is a graph of leakage current versus sense node maximum voltage change time for the high-voltage reset sensor interface circuit of FIG. 3.

FIG. 10 illustrates the impact of various leakage currents on the maximum voltage change on the sense node 165 over 2 minutes for the high-voltage reset sensor interface 300. FIG. 10 shows that, like the noise, the absolute change in voltage on the sense node 165 can be correlated to the leakage current.

By including a high-voltage reset switch 305, the I-V characteristics of the diodes 155 and 160 do not affect the transient voltage on the sense node 165 after the start-up phase. Deviations in the sense node 165 voltage after start-up can be correlated to leakage level currents, with the magnitude and rate of the sense node 165 voltage change corresponding to the amount of leakage. With the high-voltage reset sensor interface 300, various tests can be implemented in order to identify defects to the high impedance nodes 105 and 302 which can lead to increased noise and ultimately degrade microphone performance.

What is claimed is:

1. A method of detecting defects in a high impedance network of a MEMs microphone sensor interface circuit, the method comprising:
    adding a high-voltage reset switch to a high-voltage high impedance network;
    closing the high-voltage reset switch during a start-up phase of the MEMs microphone sensor interface circuit;
    closing a low-voltage reset switch of a low-voltage high impedance network during the start-up phase;
    simultaneously opening the high-voltage reset switch and the low-voltage reset switch at the end of the start-up phase; and
    detecting a defect in the high-voltage high impedance network or the low-voltage high impedance network immediately after opening the high-voltage reset switch and the low-voltage reset switch.

2. The method of claim 1, wherein the defect is a leakage current between a bias node of the MEMs microphone sensor interface circuit and ground.

3. The method of claim 1, wherein the defect is a leakage current between a bias node of the MEMs microphone sensor interface circuit and a sense node of the MEMs microphone sensor interface circuit.

4. The method of claim 1, wherein the defect is caused particles, surface contamination or bulk material defects.

5. The method of claim 1, wherein the defect is a leakage current through one or more diodes of anti-parallel diodes of the high-voltage high impedance network or the low-voltage high impedance network.

6. A high-voltage reset MEMs microphone sensor interface circuit, the circuit comprising:
    a charge pump;
    a low-voltage high impedance network coupled to a direct current potential and to a sense node, the low-voltage high impedance network including a set of anti-parallel diodes and a low-voltage reset switch;
    a high-voltage high impedance network coupled to the charge pump and to a bias node, the high-voltage high impedance network including a set of anti-parallel diodes and a high-voltage reset switch;

a sense capacitor coupled between the sense node and the bias node;

a high impedance amplifier coupled to the sense node; and an output capacitor coupled between the bias node and ground;

wherein the low-voltage reset switch and the high-voltage reset switch are closed during a start-up phase of the MEMs microphone sensor interface circuit and simultaneously opened at an end of the start-up phase.

7. The high-voltage reset MEMs microphone sensor interface circuit of claim 6, wherein a defect in the low-voltage high impedance network or the high-voltage high impedance network is detected immediately after the low-voltage reset switch and the high-voltage reset switch are opened.

8. The high-voltage reset MEMs microphone sensor interface circuit of claim 7, wherein the defect is a leakage current between the bias node of the MEMs microphone sensor interface circuit and ground.

9. The high-voltage reset MEMs microphone sensor interface circuit of claim 7, wherein the defect is a leakage current between the bias node of the MEMs microphone sensor interface circuit and the sense node of the MEMs microphone sensor interface circuit.

10. The high-voltage reset MEMs microphone sensor interface circuit of claim 7, wherein the defect is caused particles, surface contamination or bulk material defects.

11. The high-voltage reset MEMs microphone sensor interface circuit of claim 7, wherein the defect is a leakage current through one or more diodes of the anti-parallel diodes of the high-voltage high impedance network or the low-voltage high impedance network.

* * * * *